US012738949B2

(12) United States Patent
Lee et al.

(10) Patent No.: US 12,738,949 B2
(45) Date of Patent: Sep. 15, 2026

(54) RAMP GENERATOR AND IMAGE SENSING DEVICE

(71) Applicant: NOVATEK Microelectronics Corp., Hsinchu (TW)

(72) Inventors: Yueh-Ru Lee, Chiayi City (TW); Pai-Hsiang Hsu, Hsinchu City (TW)

(73) Assignee: NOVATEK Microelectronics Corp., Hsinchu (TW)

( * ) Notice: Subject to any disclaimer, the term of this patent is extended or adjusted under 35 U.S.C. 154(b) by 22 days.

(21) Appl. No.: 19/064,629

(22) Filed: Feb. 26, 2025

(65) Prior Publication Data

US 2026/0254458 A1 Aug. 27, 2026

(51) Int. Cl.
*H03M 1/06* (2006.01)
*H04N 25/616* (2023.01)
*H04N 25/78* (2023.01)

(52) U.S. Cl.
CPC ........ *H03M 1/0604* (2013.01); *H04N 25/616* (2023.01); *H04N 25/78* (2023.01)

(58) Field of Classification Search
CPC .... H03M 1/0604; H04N 25/616; H04N 25/78
USPC .......................................................... 348/302
See application file for complete search history.

(56) References Cited

U.S. PATENT DOCUMENTS 9,331,683 B2 * 5/2016 Yoo .......................... H03K 4/08
9,380,208 B1 6/2016 Yuan et al.
9,554,074 B2 1/2017 Zuo et al.
10,264,200 B2 4/2019 Johansson
10,630,310 B1 * 4/2020 Litjes .................... H03M 1/462
12,224,766 B2 * 2/2025 Cho .................... H03M 1/1245
12,355,454 B2 * 7/2025 Litjes ...................... H03M 1/38
2005/0243193 A1 11/2005 Gove et al.
2009/0251583 A1 10/2009 Kim et al.
2015/0263714 A1 9/2015 Yoo
2016/0309106 A1 * 10/2016 Zuo ........................ H04N 25/60
2018/0184022 A1 * 6/2018 Johansson ............ H04N 25/618
2023/0163778 A1 * 5/2023 Cho ........................ H03M 1/38
341/161
2024/0405780 A1 * 12/2024 Litjes .................... H03M 1/466
2025/0337433 A1 * 10/2025 Kim ........................ H03M 1/46

FOREIGN PATENT DOCUMENTS

TW 200721649 A 6/2007
TW 202329639 A 7/2023
TW 202341664 A 10/2023

* cited by examiner

*Primary Examiner* — Pritham D Prabhakher
(74) *Attorney, Agent, or Firm* — CKC & Partners Co., LLC

(57) ABSTRACT

A ramp generator includes a digital-to-analog converter, a first capacitor, a second capacitor and a noise cancellation circuit. The digital-to-analog converter is configured to generate a ramp-up voltage signal on a first output terminal and a ramp-down voltage signal on a second output terminal. The first capacitor is coupled between the first output terminal and an intermediate node. The second capacitor is coupled between the second output terminal and the intermediate node. The noise cancellation circuit is coupled with the intermediate node. The noise cancellation circuit is configured to provide a compensation feedback according to an intermediate voltage on the intermediate node.

18 Claims, 7 Drawing Sheets

V_CMP
222c
222
222b
222a
V_FB2
C5
C3
C4
C6
V_PIX
SW
V_BIAS
V_RMP_BUF
100
120
DB_0
DB_N
AVDD
MP2
MP1
CS
122
D_0
D_N
V_N
C2
C1
140D
224
V_RMP_OUT
V_RMP-
V_RMP+

RAMP GENERATOR AND IMAGE SENSING DEVICE

BACKGROUND

Field of Invention

The disclosure relates to a ramp generator and an image sensing device. More particularly, the disclosure relates to a ramp generator capable of reducing an intrinsic noise of a digital-to-analog converter within the ramp generator.

Description of Related Art

A ramp generator is a circuit that generates a signal that increases linearly with time, often used in analog-to-digital converters (ADCs). In a CMOS image sensor (CIS), the ramp generator plays a crucial role in converting the analog pixel output to a digital signal. The CMOS image sensor typically utilizes a single-slope ADC (SS-ADC) architecture due to its simplicity, low power consumption, and high linearity. Within this architecture, the ramp generator provides the reference voltage that each pixel's output is compared against to determine its digital value.

SUMMARY

An embodiment of the disclosure provides a ramp generator, which includes a digital-to-analog converter, a first capacitor, a second capacitor and a noise cancellation circuit. The digital-to-analog converter has a first output terminal and a second output terminal. The digital-to-analog converter is configured to generate a ramp-up voltage signal on the first output terminal and a ramp-down voltage signal on the second output terminal. The first capacitor is coupled between the first output terminal and an intermediate node. The second capacitor is coupled between the second output terminal and the intermediate node. The noise cancellation circuit is coupled with the intermediate node. The noise cancellation circuit is configured to provide a compensation feedback according to an intermediate voltage on the intermediate node.

Another embodiment of the disclosure provides an image sensing device. The image sensing device includes a ramp generator and an image readout circuit. The ramp generator is configured to generate a ramp output signal. The ramp generator includes a digital-to-analog converter, a first capacitor, a second capacitor and a noise cancellation circuit. The digital-to-analog converter has a first output terminal and a second output terminal. The digital-to-analog converter is configured to generate a ramp-up voltage signal on the first output terminal and a ramp-down voltage signal on the second output terminal. The first capacitor is coupled between the first output terminal and an intermediate node. The second capacitor is coupled between the second output terminal and the intermediate node. The noise cancellation circuit is coupled with the intermediate node. The noise cancellation circuit is configured to provide a compensation feedback according to an intermediate voltage on the intermediate node. The image readout circuit is coupled to the ramp generator and a photoelectric sensing pixel. The image readout circuit is configured to sample a pixel sensing voltage from the photoelectric sensing pixel in reference with the ramp output signal from the ramp generator, so as to generate a digital output signal.

It is to be understood that both the foregoing general description and the following detailed description are by examples, and are intended to provide further explanation of the invention as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
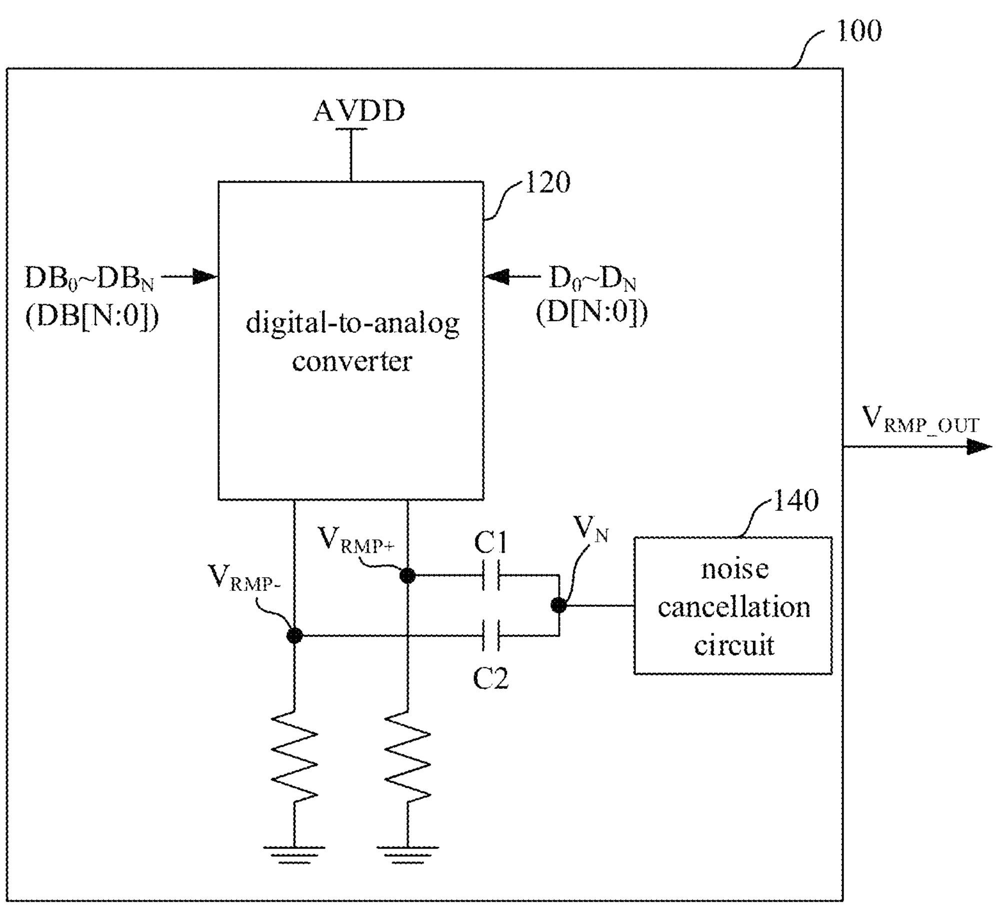
FIG. 1 is a schematic diagram illustrating a ramp generator according to some embodiments of the disclosure.

Reference will now be made in detail to the present embodiments of the disclosure, examples of which are illustrated in the accompanying drawings. Wherever possible, the same reference numbers are used in the drawings and the description to refer to the same or like parts.

Reference is made to FIG. 1, which is a schematic diagram illustrating a ramp generator 100 according to some embodiments of the disclosure. As shown in FIG. 1, the ramp generator 100 includes a digital-to-analog converter (DAC) 120, a first capacitor C1, a second capacitor C2 and a noise cancellation circuit 140.

In some embodiments, the ramp generator 100 is a DAC-based ramp generator. As shown in FIG. 1, the digital-to-analog converter 120 is configured to generate a ramp-up voltage signal $V_{RMP+}$ according to a first digital code D[N:0] (including code bits $D_0$~$D_N$) on a first output terminal of the digital-to-analog converter 120. The ramp-up voltage signal $V_{RMP+}$ is a voltage signal linearly increasing over time. For example, as the first digital code D[N:0] decreases over time (e.g., counting down from 255 to 0), the ramp-up voltage signal $V_{RMP+}$ generated by the digital-to-analog converter 120 may increase from a low voltage level to a high voltage level.

In the meantime, the digital-to-analog converter 120 is configured to generate a ramp-down voltage signal $V_{RMP-}$ according to a second digital code DB [N:0] (including code bits $DB_0$~$DB_N$) on a second output terminal of the digital-to-analog converter 120. The second digital code DB [N:0] can be complemental code relative to the first digital code D[N:0]. The ramp-down voltage signal $V_{RMP-}$ is a voltage signal linearly decreasing over time. For example, as the second digital code DB [N:0] increases over time (e.g., counting down from 0 to 255), the ramp-down voltage signal $V_{RMP-}$ generated by the digital-to-analog converter 120 may decrease from a high voltage level to a low voltage level.

In some embodiments, the ramp generator 100 is able to generate a ramp output signal $V_{RMP\_OUT}$ according to one of the ramp-up voltage signal $V_{RMP+}$ or the ramp-down voltage signal $V_{RMP-}$ according to a practical requirement (e.g., a ramp signal requirement of a subsequent circuit connected with the ramp generator 100).

If the ramp output signal $V_{RMP\_OUT}$ is required to linearly increase over time, the ramp-up voltage signal $V_{RMP+}$ can be outputted by the ramp generator 100 as the ramp output signal $V_{RMP\_OUT}$. On the other hand, if the ramp output signal $V_{RMP\_OUT}$ is required to linearly decrease over time, the ramp-down voltage signal $V_{RMP-}$ can be outputted by the ramp generator 100 as the ramp output signal $V_{RMP\_OUT}$.

Figure 2:
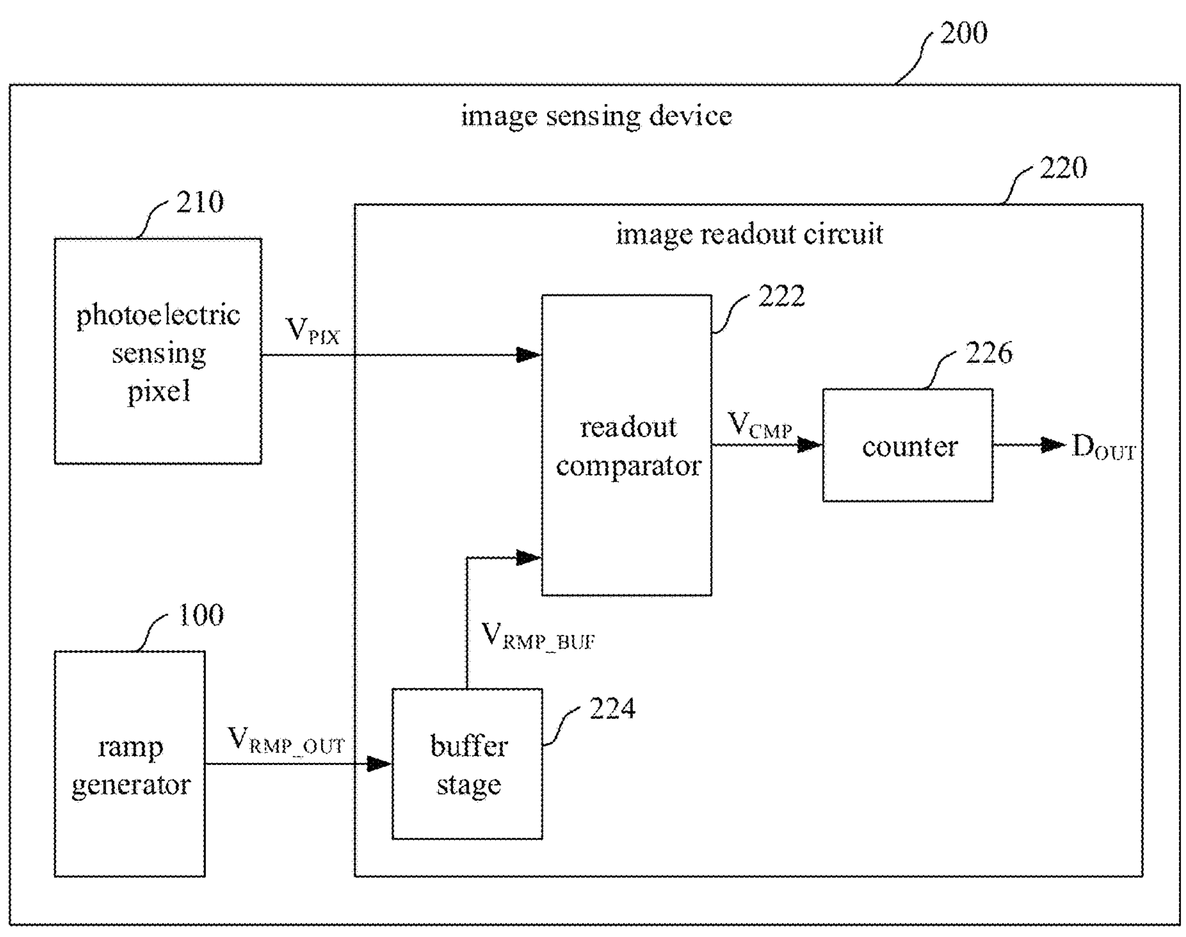
FIG. 2 is a schematic diagram illustrating an image sensing device according to some embodiments of this disclosure.

In some embodiments, the ramp output signal $V_{RMP\_OUT}$ and the ramp generator 100 can be utilized in an image sensing device. Reference is further made to FIG. 2, which is a schematic diagram illustrating an image sensing device 200 according to some embodiments of this disclosure.

As shown in FIG. 2, the image sensing device 200 includes the ramp generator 100, a photoelectric sensing pixel 210 and an image readout circuit 220. In some embodiments, the photoelectric sensing pixel 210 may include an image sensor (e.g., a CMOS image sensor, a CCD image sensor or a photodiode sensor), capable of sensing an optical input signal and generate a pixel sensing voltage $V_{PIX}$ accordingly. The image readout circuit 220 is coupled with the photoelectric sensing pixel 210 and the ramp generator 100. The image readout circuit 220 is configured to sample the pixel sensing voltage $V_{PIX}$ in reference with the ramp output signal $V_{RMP\_OUT}$ from the ramp generator 100, so as to generate a digital output signal Dour. The digital output signal DOUT is configured to indicate a gray level or a brightness level of the pixel sensing voltage $V_{PIX}$.

As embodiments shown in FIG. 2, the image readout circuit 220 includes a readout comparator 222, a buffer stage 224 and a counter 226.

The buffer stage 224 is coupled to the ramp generator 100. The buffer stage 224 is configured to generate a ramp buffer signal $V_{RMP\_BUF}$ according to the ramp output signal $V_{RMP\_OUT}$. In some embodiments, the buffer stage 224 can be implemented by a source follower. The input signal (i.e., the ramp output signal $V_{RMP\_OUT}$) to the buffer stage 224 and the ramp buffer signal $V_{RMP\_BUF}$ generated by the buffer stage 224 are analog voltage signals that maintain closely similar amplitudes and waveforms. The ramp buffer signal $V_{RMP\_BUF}$ and the ramp output signal $V_{RMP\_OUT}$ are different in their impedance characteristics. The input signal (i.e., the ramp output signal $V_{RMP\_OUT}$) is fed into a high impedance terminal, whereas the ramp buffer signal $V_{RMP\_BUF}$ is output with low impedance, enabling it to drive subsequent stages more robustly.

The readout comparator 222 is coupled to the buffer stage 224 and the photoelectric sensing pixel 210. The readout comparator 222 is configured to compare the pixel sensing voltage $V_{PIX}$ from the photoelectric sensing pixel 210 with the ramp buffer signal $V_{RMP\_BUF}$ for generating a comparison result $V_{CMP}$. The counter 226 is coupled to the readout comparator (222), and configured to generate a digital output signal Dour according to a time count about variance of the comparison result $V_{CMP}$. Because the ramp buffer signal $V_{RMP\_BUF}$ linearly changes over time, a time count corresponding to variance of the comparison result $V_{CMP}$ will reflect a brightness level or a gray level corresponding to the pixel sensing voltage $V_{PIX}$. Therefore, the digital output signal Dour is able to indicate the gray level or the brightness level of the pixel sensing voltage $V_{PIX}$.

In some other embodiments, the ramp generator 100 shown in FIG. 1 is not limited to be used in the image sensing device 200 as shown in FIG. 2. The ramp output signal VRMP_OUT generated by the ramp generator 100 can be utilized by various circuits across different applications (e.g., analog-to-digital converters, phase-locked loops, voltage-controlled oscillators, proximity sensors, capacitive sensing, chirp signal generators).

In some embodiments, the ramp generator may suffer some noise issues, particularly intrinsic noises induced by the digital-to-analog converter. These noises negatively affects a signal quality of the ramp output signal $V_{RMP\_OUT}$ and may further reduce an accuracy of the digital output signal Dour in image sensing, particularly in low-light situations.

In some embodiments, the ramp generator 100 include a noise cancellation structure (including the first capacitor C1, the second capacitor C2 and the noise cancellation circuit 140 as shown in FIG. 1) to suppress both common-mode and differential noises.

As shown in FIG. 1, the first capacitor C1 and the second capacitor C2 are connected in series between the first output terminal (where the ramp-up voltage signal $V_{RMP+}$ is formed) of the digital-to-analog converter 120 and the second output terminal (where the ramp-up voltage signal $V_{RMP-}$ is formed) of the digital-to-analog converter 120. An intermediate voltage $V_N$ is formed at an intermediate node between the first capacitor C1 and the second capacitor C2.

In other words, the first capacitor C1 is coupled between the first output terminal of the digital-to-analog converter 120 and the intermediate node, and the second capacitor C2 is coupled between the second output terminal of the digital-to-analog converter 120 and the intermediate node.

In some embodiments, an alternating-current component (e.g., AC noise) of the ramp-up voltage signal $V_{RMP+}$ will couple through the first capacitor C1 to the intermediate voltage $V_N$, and also another alternating-current component (e.g., AC noise) of the ramp-down voltage signal $V_{RMP-}$ will couple through the second capacitor C2 to the intermediate voltage $V_N$. In other words, an alternating-current component of the intermediate voltage $V_N$ may carry noise information from both of the ramp-up voltage signal $V_{RMP+}$ and the ramp-down voltage signal $V_{RMP-}$.

As shown in FIG. 1, the noise cancellation circuit 140 is coupled with the intermediate node. The noise cancellation circuit 140 is configured to provide a compensation feedback according to an intermediate voltage $V_N$ on the intermediate node. The compensation feedback is correlated to the alternating-current component of the intermediate voltage $V_N$. The compensation feedback generated by the noise cancellation circuit 140 is configured for compensating an intrinsic noise of the digital-to-analog converter 120.

Figure 3:
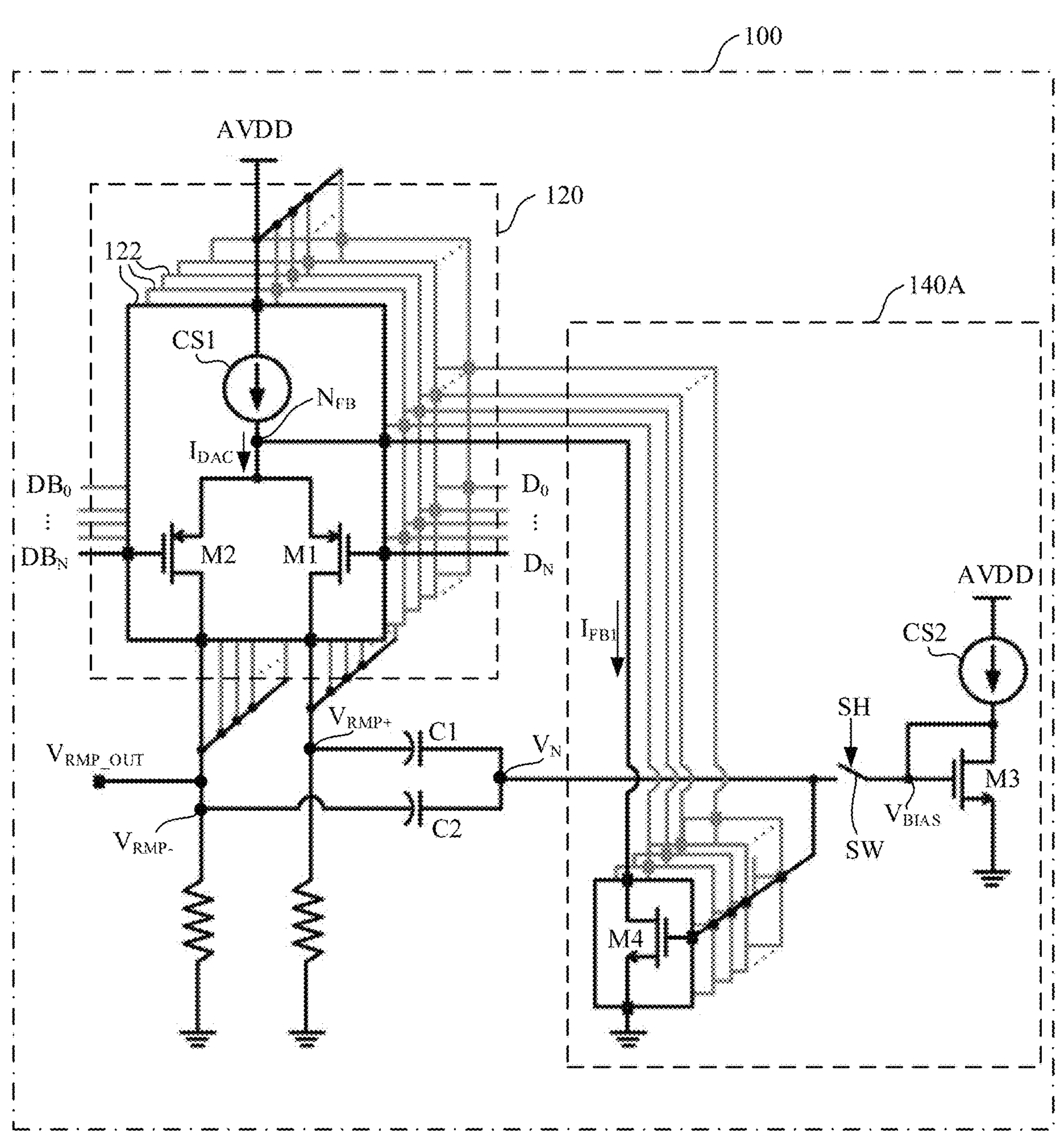
FIG. 3 is a schematic diagram illustrating an internal structure of the ramp generator according to some embodiments of the disclosure.

Reference is further made to FIG. 3, which is a schematic diagram illustrating an internal structure of the ramp generator 100 according to some embodiments of the disclosure. As shown in the FIG. 3, the digital-to-analog converter 120 includes multiple digital-to-analog converter units 122. Each of the digital-to-analog converter units 122 includes a first current source CS1, a first transistor M1 and a second transistor M2.

The first transistor M1 in each of the digital-to-analog converter units 122 is controlled by one code bit $D_0$~$D_N$ of the first digital code D[N:0] for generating the ramp-up voltage signal $V_{RMP+}$. In the embodiments shown in FIG. 3, the first transistor M1 is implemented by a PMOS transistor. As the first digital code D[N:0] decreases over time, more of the first transistors M1 in the digital-to-analog converter units 122 tend to be turned on, such that a voltage level of the ramp-up voltage signal $V_{RMP+}$ increases over time.

On the other hand, the second transistor M2 in each of the digital-to-analog converter units 122 is controlled by one code bit $DB_0$~$DB_N$ of the second digital code DB [N:0] for generating the ramp-down voltage signal $V_{RMP-}$. As the second digital code D[N:0] increases over time, more of the second transistors M2 in the digital-to-analog converter units 122 tend to be turned off, such that a voltage level of the ramp-down voltage signal $V_{RMP-}$ decreases over time. In this embodiments shown in FIG. 3, the ramp-down voltage signal $V_{RMP-}$ is outputted as the ramp output signal $V_{RMP\_OUT}$.

The noise cancellation circuit 140A shown in FIG. 3 is one embodiment to implement the noise cancellation circuit 140 shown in FIG. 1. As shown in FIG. 3, the noise cancellation circuit 140A includes a third transistor M3, a switch SW and multiple fourth transistors M4. A drain terminal and a gate terminal of the third transistor M3 are connected to a second current source CS2 for forming a bias voltage $V_{BIAS}$. The switch SW is coupled between the third transistor M3 and the intermediate node. The switch SW is controlled by a control signal SH. Gate terminals of the fourth transistors M4 are connected together to the intermediate node and controlled by the intermediate voltage $V_N$. Each of drain terminals of the fourth transistors M4 is connected to a feedback node NFB and the first current source CS1 in each of the digital-to-analog converter units 122.

In the embodiment shown in FIG. 3, the third transistor M3 and the fourth transistors M4 are NMOS transistor. The noise cancellation circuit 140A is formed by in a structure of a NMOS current mirror.

Figure 4:
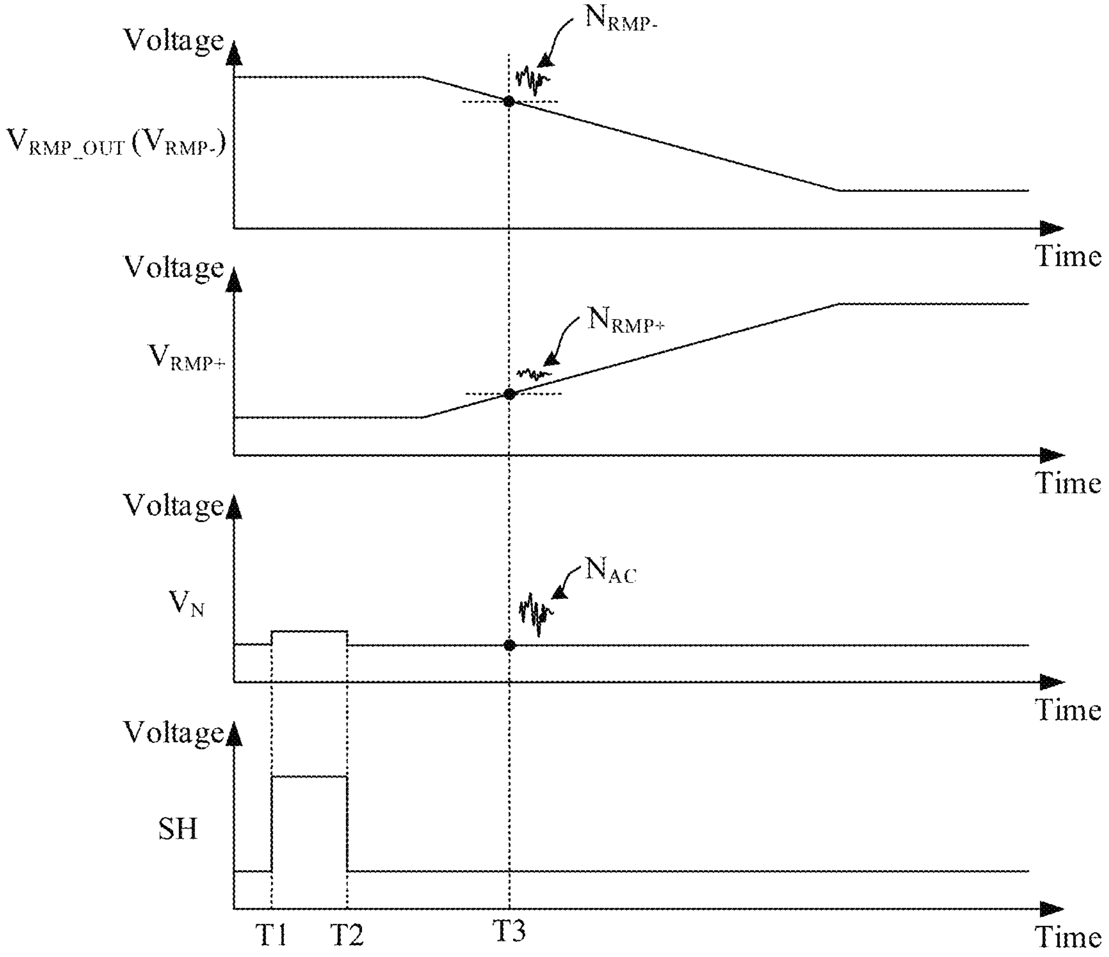
FIG. 4 is a signal waveform diagram illustrating waveforms of the ramp-up voltage signal, the ramp-down voltage signal, the intermediate voltage and the control signal in some embodiments.

Reference is further made to FIG. 4, which is a signal waveform diagram illustrating waveforms of the ramp-up voltage signal $V_{RMP+}$, the ramp-down voltage signal $V_{RMP-}$ (i.e., the ramp output signal $V_{RMP\_OUT}$), the intermediate voltage $V_N$ and the control signal SH in some embodiments.

As shown in FIG. 3 and FIG. 4, from time points T1 to T2, the control signal SH is set at a high level, such that the switch SW is switched on to reset a direct-current level of the intermediate voltage $V_N$ according to the bias voltage $V_{BIAS}$. After the time point T2, the direct-current level of the intermediate voltage $V_N$ will be changed into $V_{BIAS}+\Delta V_{inj}$, in which $\Delta V_{inj}$ is a charge injection voltage generated as the switch SW is off.

As shown in FIG. 3 and FIG. 4, at the time point T3, an alternating-current component $N_{RMP+}$ (i.e., AC noise) of the ramp-up voltage signal $V_{RMP+}$ will couple through the first capacitor C1 to the intermediate voltage $V_N$, and also an alternating-current component $N_{RMP-}$0 (i.e., AC noise) of the ramp-down voltage signal $V_{RMP-}$ will couple through the second capacitor C2 to the intermediate voltage $V_N$. In other words, an alternating-current component $N_{AC}$ of the intermediate voltage $V_N$ may carry AC noises from both of the ramp-up voltage signal $V_{RMP+}$ and the ramp-down voltage signal $V_{RMP-}$.

In some embodiments, the alternating-current component $N_{RMP+}$ and the alternating-current component $N_{RMP-}$ (i.e., AC noises) are positively correlated with an operating current $I_{DAC}$ of the digital-to-analog converter 120. The operating current $I_{DAC}$ is generated by the first current source CS1 and flows through the first transistors M1 and the second transistors M2. When the operating current $I_{DAC}$ increases, the AC noises (i.e., $N_{RMP+}$ and $N_{RMP-}$) increases correspondingly.

When levels of the AC noises on the ramp-up voltage signal $V_{RMP+}$ and the ramp-down voltage signal $V_{RMP-}$ are higher, a level of the alternating-current component $N_{AC}$ of the intermediate voltage $V_N$ will be higher. In this case, the fourth transistors M4 tend to be turned on, and current amplitudes of diverged currents $I_{FB1}$ passing through the fourth transistors M4 are higher. As shown in FIG. 3, the feedback node NFB is located between the first current source CS1 and the transistors (i.e., the first transistors M1 and the second transistors M2) in each of the digital-to-analog converter units 122. As shown in FIG. 3, the diverged currents $I_{FB1}$ diverged from the feedback node NFB competes with the operating current $I_{DAC}$ of the digital-to-analog converter 120. Therefore, the diverged currents $I_{FB1}$ is configured to suppress the operating current $I_{DAC}$ of the digital-to-analog converter 120.

On the other hand, when levels of the AC noises on the ramp-up voltage signal $V_{RMP+}$ and the ramp-down voltage signal $V_{RMP-}$ are lower, a level of the alternating-current component $N_{AC}$ of the intermediate voltage $V_N$ will be lower. In this case, the fourth transistors M4 tend to be turned off, and current amplitudes of diverged currents $I_{FB1}$ passing through the fourth transistors M4 are lower. It will impose less suppression to the operating current $I_{DAC}$.

In this case, the diverged currents $I_{FB1}$ can be regarded as a compensation feedback for compensating the intrinsic noise of the digital-to-analog converter 120.

Figure 5:
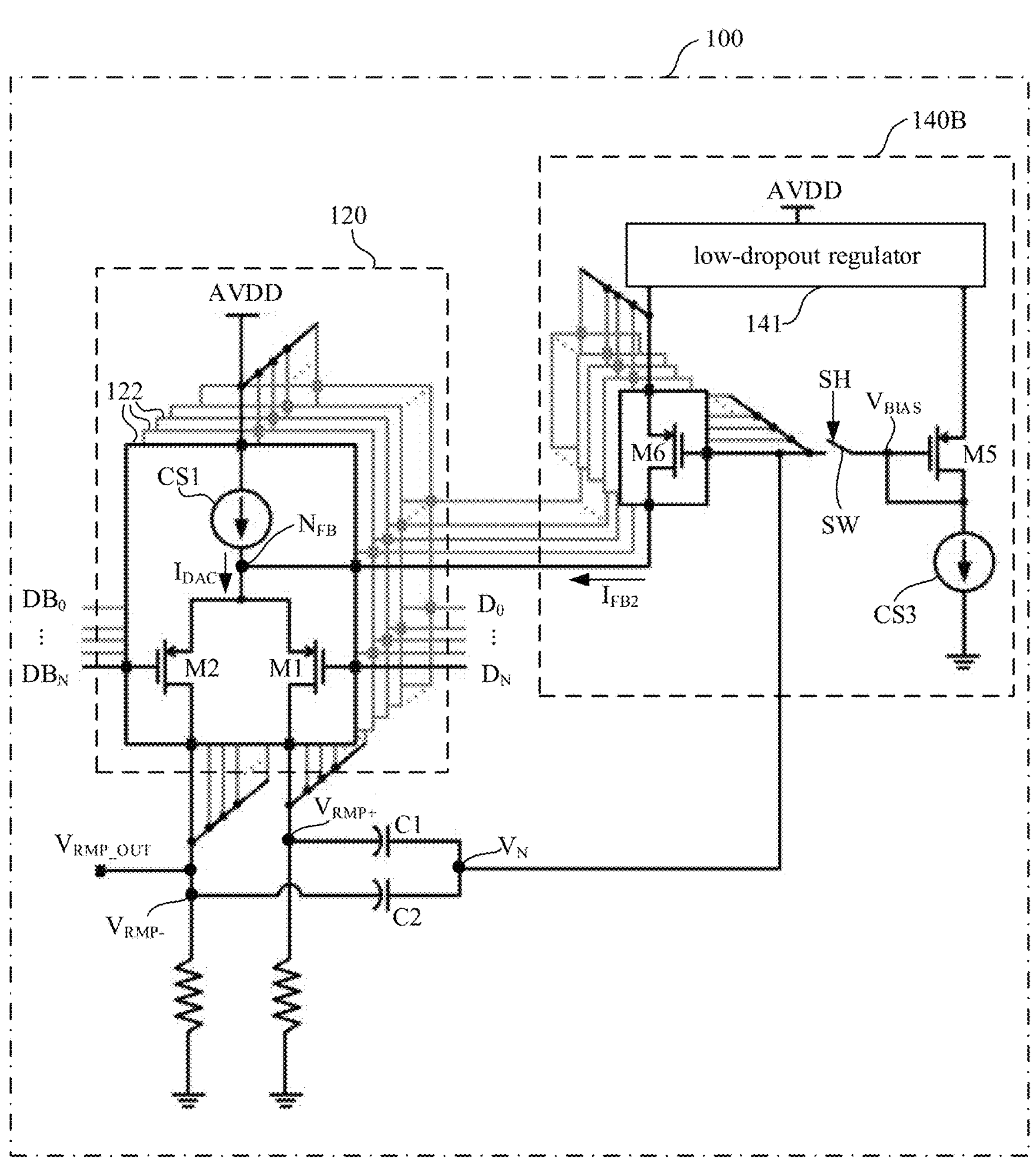
FIG. 5 is a schematic diagram illustrating an internal structure of the ramp generator according to some embodiments of the disclosure.

Reference is further made to FIG. 5, which is a schematic diagram illustrating an internal structure of the ramp generator 100 according to some embodiments of the disclosure. As shown in the FIG. 5, the ramp generator 100 includes the digital-to-analog converter 120, the first capacitor C1, the second capacitor C2 and the noise cancellation circuit 140B.

The digital-to-analog converter 120, the first capacitor C1, the second capacitor C2 shown in FIG. 5 are similar to the digital-to-analog converter 120, the first capacitor C1, the second capacitor C2 shown in FIG. 3, and are not repeated again.

The noise cancellation circuit 140B shown in FIG. 5 illustrates another embodiment to implement the noise cancellation circuit 140 in FIG. 1. As shown in FIG. 5, the noise cancellation circuit 140B includes a low-dropout regulator 141, a fifth transistor M5, a switch SW and multiple sixth transistors M6.

The low-dropout (LDO) regulator 141 is used to maintain a stable output voltage generated from a system power voltage AVDD. The low-dropout (LDO) regulator 141 is also configured to filter out a voltage noise on the system power voltage AVDD. A drain terminal and a gate terminal of the fifth transistor M5 are connected to a third current source CS3 for forming a bias voltage $V_{BIAS}$. A source terminal of the fifth transistor M5 is the low-dropout regulator 141. The switch SW is coupled between the fifth transistor M5 and the intermediate node. The switch SW is controlled by the control signal SH. Gate terminals of the sixth transistors M6 are connected together to the intermediate node and controlled by the intermediate voltage $V_N$. Each of drain terminals of the sixth transistors M6 is connected to a feedback node NFB and the first current source CS1 in each of the digital-to-analog converter units 122.

In the embodiment shown in FIG. 5, the fifth transistor M5 and the sixth transistors M6 are PMOS transistor. The noise cancellation circuit 140B is formed by in a structure of a PMOS current mirror.

Waveforms illustrated in FIG. 4 can also be applied to the ramp generator 100 and the noise cancellation circuit 140B shown in FIG. 5.

As shown in FIG. 4 and FIG. 5, from time points T1 to T2, the control signal SH is set at a high level, such that the switch SW is switched on to reset a direct-current level of the intermediate voltage $V_N$ according to the bias voltage $V_{BIAS}$. After the time point T2, the direct-current level of the intermediate voltage $V_N$ will be changed into $V_{BIAS}+\Delta V_{inj}$.

As shown in FIG. 4 and FIG. 5, at the time point T3, an alternating-current component $N_{RMP+}$ (i.e., AC noise) of the ramp-up voltage signal $V_{RMP+}$ will couple through the first capacitor C1 to the intermediate voltage $V_N$, and also an alternating-current component $N_{RMP-}$ (i.e., AC noise) of the ramp-down voltage signal $V_{RMP-}$ will couple through the second capacitor C2 to the intermediate voltage $V_N$. In other words, an alternating-current component $N_{AC}$ of the intermediate voltage $V_N$ may carry AC noises from both of the ramp-up voltage signal $V_{RMP+}$ and the ramp-down voltage signal $V_{RMP-}$.

As shown in FIG. 5, each of the sixth transistors M6 is configured to form a supplemental current $I_{FB2}$ to the feedback node NFB in the digital-to-analog converter 120. The supplemental current $I_{FB2}$ is added to the operating current $I_{DAC}$ of the digital-to-analog converter 120. The supplemental current $I_{FB2}$ and the operating current $I_{DAC}$ will flow through the first transistors M1 and the second transistors M2 for forming the ramp-up voltage signal $V_{RMP+}$ and the ramp-down voltage signal $V_{RMP-}$.

In some embodiments, the alternating-current component $N_{RMP+}$ and the alternating-current component $N_{RMP-}$ (i.e., AC noises) are positively correlated with an operating current $I_{DAC}$ of the digital-to-analog converter 120. The current amplitude of the supplemental current $I_{FB2}$ is negatively correlated with the alternating-current component of the intermediate voltage $V_N$ (because the sixth transistors M6 are PMOS).

When levels of the AC noises on the ramp-up voltage signal $V_{RMP+}$ and the ramp-down voltage signal $V_{RMP-}$ are higher, a level of the alternating-current component $N_{AC}$ of the intermediate voltage $V_N$ will be higher. In this case, the sixth transistors M6 tend to be turned off, and current amplitudes of supplemental currents $I_{FB2}$ passing through the sixth transistors M6 are lower. In other words, when the levels of the AC noises are higher, the current amplitudes of the supplemental currents $I_{FB2}$ are lower.

On the other hand, when levels of the AC noises on the ramp-up voltage signal $V_{RMP+}$ and the ramp-down voltage signal $V_{RMP-}$ are lower, a level of the alternating-current component $N_{AC}$ of the intermediate voltage $V_N$ will be lower. In this case, the sixth transistors M6 tend to be turned on, and current amplitudes of the supplemental currents $I_{FB2}$ passing through the sixth transistors M6 are higher. In other words, when the levels of the AC noises are lower, the current amplitudes of the supplemental currents $I_{FB2}$ are higher.

In this case, the supplemental currents $I_{FB2}$ can be regarded as a compensation feedback for compensating the intrinsic noise of the digital-to-analog converter 120.

The noise cancellation circuit 140A shown in FIG. 3 and noise cancellation circuit 140B shown in FIG. 5 are configured to generate compensation feedbacks (i.e, the diverged currents $I_{FB1}$ and the supplemental currents $I_{FB2}$) to the digital-to-analog converter 120 inside the ramp generator 100. However, the disclosure is not limited thereto. In some other embodiments, the compensation feedback generated by the noise cancellation circuit 140 in FIG. 1 can be fed to other circuitry components (e.g., the readout comparator 222 or the buffer stage 224 shown in FIG. 2).

Figure 6:
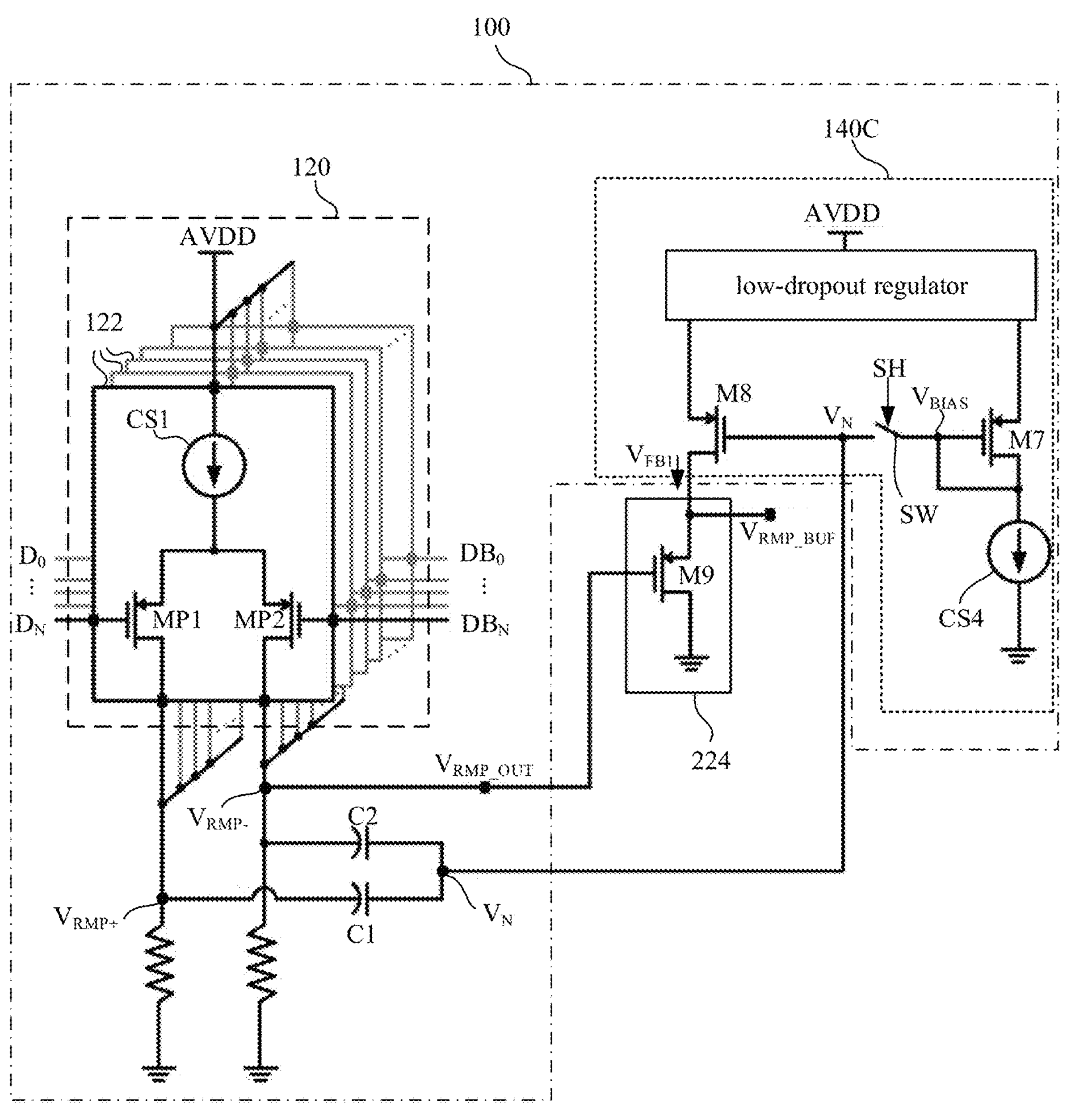
FIG. 6 is a schematic diagram illustrating the ramp generator according to some embodiments of the disclosure.

Reference is further made to FIG. 6, which is a schematic diagram illustrating the ramp generator 100 according to some embodiments of the disclosure. As shown in the FIG. 6, the ramp generator 100 includes the digital-to-analog converter 120, the first capacitor C1, the second capacitor C2 and the noise cancellation circuit 140C. The digital-to-analog converter 120, the first capacitor C1, the second capacitor C2 shown in FIG. 6 are similar to the digital-to-analog converter 120, the first capacitor C1, the second capacitor C2 shown in FIG. 3, and are not repeated again.

The noise cancellation circuit 140C shown in FIG. 6 is configured generate a compensation feedback (i.e., a supplemental voltage $V_{FB1}$) to the buffer stage 224.

As shown in FIG. 2 and FIG. 6, the buffer stage 224 is implemented by a source follower, which includes a ninth transistor M9. A gate terminal of the ninth transistor M9 is configured to receive the ramp output signal $V_{RMP\_OUT}$ (i.e., the ramp-down voltage signal $V_{RMP-}$). A drain terminal of the ninth transistor M9 is configured to generate the ramp buffer signal $V_{RMP\_BUF}$. AS shown in FIG. 2, the ramp buffer signal $V_{RMP\_BUF}$ is transmitted to the readout comparator 222 as a reference for comparison.

As shown in FIG. 6, the noise cancellation circuit 140C includes a low-dropout regulator 141, a seventh transistor M7, a switch SW and an eighth transistor. The low-dropout (LDO) regulator 141 is used to maintain a stable output voltage generated from a system power voltage AVDD. The low-dropout (LDO) regulator 141 is also configured to filter out a voltage noise on the system power voltage AVDD. A drain terminal and a gate terminal of the seventh transistor M7 are connected to a fourth current source CS4 for forming a bias voltage $V_{BIAS}$. A source terminal of the seventh transistor M7 is connected to the low-dropout regulator 141. The switch SW is coupled between the seventh transistor M7 and the intermediate node. The switch SW is controlled by the control signal SH. A gate terminal of the eighth transistor M8 is connected to the intermediate node. A drain terminal of the eighth transistor M8 is connected to the buffer stage 224.

Waveforms illustrated in FIG. 4 can also be applied to the ramp generator 100 and the noise cancellation circuit 140C shown in FIG. 6.

As shown in FIG. 4 and FIG. 6, from time points T1 to T2, the control signal SH is set at a high level, such that the switch SW is switched on to reset a direct-current level of the intermediate voltage $V_N$ according to the bias voltage $V_{BIAS}$. After the time point T2, the direct-current level of the intermediate voltage $V_N$ will be changed into $V_{BIAS}+\Delta V_{inj}$.

As shown in FIG. 4 and FIG. 6, at the time point T3, an alternating-current component $N_{RMP+}$ (i.e., AC noise) of the ramp-up voltage signal $V_{RMP+}$ will couple through the first capacitor C1 to the intermediate voltage $V_N$, and also an alternating-current component $N_{RMP-}$ (i.e., AC noise) of the ramp-down voltage signal $V_{RMP-}$ will couple through the second capacitor C2 to the intermediate voltage $V_N$.

As shown in FIG. 6, the eighth transistor M8 is configured to form a supplemental voltage $V_{FB1}$ to the drain terminal of the ninth transistor M9 in the buffer stage 224. The supplemental voltage $V_{FB1}$ is configured to raise the ramp buffer signal $V_{RMP\_BUF}$.

In some embodiments, the alternating-current component $N_{RMP+}$ and the alternating-current component $N_{RMP-}$ (i.e., AC noises) are positively correlated with an operating current $I_{DAC}$ of the digital-to-analog converter 120. A voltage level of the supplemental voltage $V_{FB1}$ is negatively correlated with the alternating-current component $N_{AC}$ of the intermediate voltage $V_N$ (because the eighth transistor M8 is PMOS).

When levels of the AC noises on the ramp-up voltage signal $V_{RMP+}$ and the ramp-down voltage signal $V_{RMP-}$ are higher, a level of the alternating-current component $N_{AC}$ of the intermediate voltage $V_N$ will be higher. In this case, the eighth transistors M8 tend to be turned off, and a level of the supplemental voltage $V_{FB1}$ is lower. In other words, when the levels of the AC noises are higher, the level of the supplemental voltage $V_{FB1}$ is lower.

On the other hand, when levels of the AC noises on the ramp-up voltage signal $V_{RMP+}$ and the ramp-down voltage signal $V_{RMP-}$ are lower, a level of the alternating-current component $N_{AC}$ of the intermediate voltage $V_N$ will be lower. In this case, the eighth transistors M8 tend to be turned on, and the level of the supplemental voltage $V_{FB1}$ is higher. In other words, when the levels of the AC noises are lower, the level of the supplemental voltage $V_{FB1}$ is higher.

In this case, the supplemental voltage $V_{FB1}$ can be regarded as a compensation feedback for compensating the intrinsic noise of the digital-to-analog converter 120.

Figure 7:
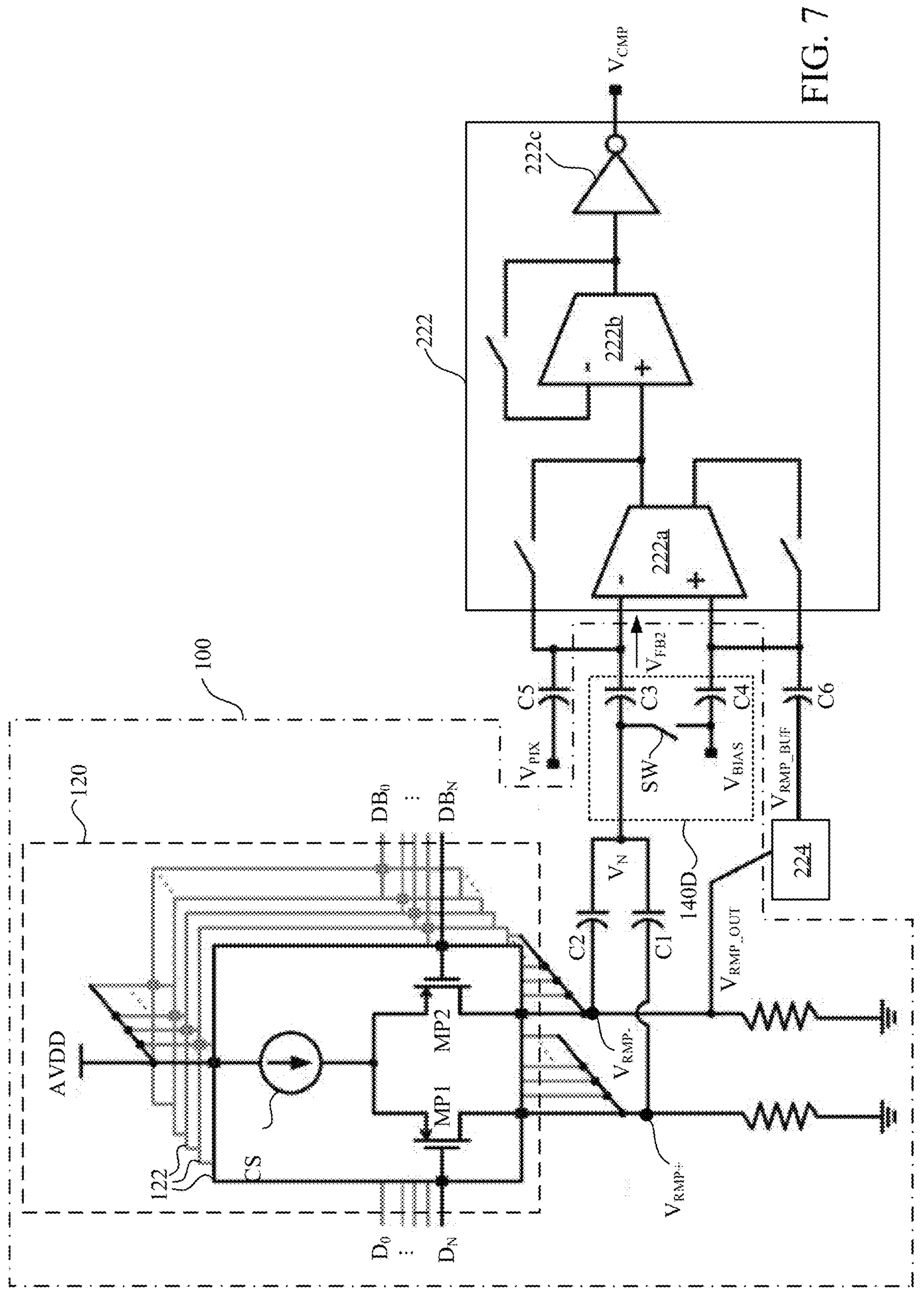
FIG. 7 is a schematic diagram illustrating the ramp generator according to some embodiments of the disclosure.

Reference is further made to FIG. 7, which is a schematic diagram illustrating the ramp generator 100 according to some embodiments of the disclosure. As shown in the FIG. 7, the ramp generator 100 includes the digital-to-analog converter 120, the first capacitor C1, the second capacitor C2 and the noise cancellation circuit 140D. The digital-to-analog converter 120, the first capacitor C1, the second capacitor C2 shown in FIG. 7 are similar to the digital-to-analog converter 120, the first capacitor C1, the second capacitor C2 shown in FIG. 3, and are not repeated again.

The noise cancellation circuit 140D shown in FIG. 7 is configured generate a compensation feedback (i.e., a supplemental voltage $V_{FB2}$) to the readout comparator 222.

As shown in FIG. 2 and FIG. 7, the buffer stage 224 is configured generate a ramp buffer signal $V_{RMP\_BUF}$ according to the ramp output signal $V_{RMP\_OUT}$. The readout comparator 222 includes a first comparator 222_a_, a second comparator 222_b_ and an inverter 222_c_. The ramp buffer signal $V_{RMP\_BUF}$ generated by the buffer stage 224 is transmitted through a sixth capacitor C6 to a positive input terminal of the first comparator 222_a_. A pixel sensing voltage $V_{PIX}$ from the photoelectric sensing pixel 210 is transmitted through a fifth capacitor C5 to a negative input of the first comparator 222_a_. The first comparator 222_a_ is configured to generate an internal comparison result $V_{CMPi}$ by comparing signals on the positive input and the negative input.

As shown in FIG. 7, the noise cancellation circuit 140D includes a third capacitor C3, a fourth capacitor C4 and a switch SW. The third capacitor C3 is coupled between a negative input of the first comparator 222_a_ and the intermediate node. The fourth capacitor C4 is coupled between a positive input of the first comparator 222_a_ and a signal source of a bias voltage $V_{BIAS}$.

The switch SW is coupled between the signal source of the bias voltage $V_{BIAS}$ and the intermediate node. The switch SW is configured to reset a direct-current level of the intermediate voltage $V_N$ on the intermediate node according to the bias voltage $V_{BIAS}$.

As shown in FIG. 7, an alternating-current component of the intermediate voltage $V_N$ can be coupled through the third capacitor C3 to the negative input of the first comparator 222_a_. Therefore, the third capacitor C3 is configured to form a supplemental voltage $V_{FB2}$, based on the alternating-current component of the intermediate voltage $V_N$, to the negative input of the first comparator 222_a_. The voltage level of the supplemental voltage $V_{FB2}$ is positively correlated with the alternating-current component of the intermediate voltage $V_N$.

The ramp buffer signal $V_{RMP\_BUF}$ is positively correlated with the ramp output signal $V_{RMP\_OUT}$ and also positively correlated with the alternating-current component $N_{RMP-}$ (i.e., AC noise induced by the digital-to-analog converter) on the ramp-down voltage signal $V_{RMP-}$ . . . Since the supplemental voltage $V_{FB2}$ is fed to the negative input of the first comparator 222_a_, the supplemental voltage $V_{FB2}$ can be regarded as suppression to the ramp buffer signal $V_{RMP\_BUF}$.

In this case, the supplemental voltage $V_{FB2}$ can be regarded as a compensation feedback for compensating the intrinsic noise of the digital-to-analog converter 120.

The noise cancellation circuit 140C shown in FIG. 6 and noise cancellation circuit 140D shown in FIG. 7 are configured to generate compensation feedbacks (i.e, the supplemental voltage $V_{FB1}$ and the supplemental voltage $V_{FB2}$) to the readout comparator 222 or the buffer stage 224 in the image readout circuit 220 shown in FIG. 2. In other words, the compensation feedback generated by the noise cancellation circuit 140 in FIG. 1 can be fed to other circuitry components outside the ramp generator 100, for compensating the intrinsic noise of the digital-to-analog converter 120 indirectly.

The disclosure provides a ramp generator with a noise cancellation circuit, which is able to reduce AC noises or intrinsic noises induced by the digital-to-analog converter 120. The image sensing device, equipped with the ramp generator with the noise cancellation circuit, is able to enhance a performance or an accuracy in image sensing, especially in low-light (dark state) conditions.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A ramp generator, comprising:

a digital-to-analog converter, having a first output terminal and a second output terminal, and configured to generate a ramp-up voltage signal on the first output terminal and a ramp-down voltage signal on the second output terminal;

a first capacitor, coupled between the first output terminal and an intermediate node;

a second capacitor, coupled between the second output terminal and the intermediate node; and a noise cancellation circuit, coupled with the intermediate node, and configured to provide a compensation feedback according to an intermediate voltage on the intermediate node, wherein the compensation feedback is correlated to an alternating-current component of the intermediate voltage, the compensation feedback is configured for compensating an intrinsic noise of the digital-to-analog converter.

2. The ramp generator of claim 1, wherein the digital-to-analog converter comprises a plurality of digital-to-analog converter units, each of the digital-to-analog converter units comprises a first current source, a first transistor and a second transistor, the first transistor in each of the digital-to-analog converter units is controlled by one code bit of a first digital code for generating the ramp-up voltage signal, the second transistor in each of the digital-to-analog converter units is controlled by one code bit of a second digital code for generating the ramp-down voltage signal.

3. The ramp generator of claim 2, wherein the noise cancellation circuit comprises:

a third transistor, wherein a drain terminal and a gate terminal of the third transistor are connected to a second current source for forming a bias voltage;

a switch, coupled between the third transistor and the intermediate node; and a plurality of fourth transistors, wherein gate terminals of the fourth transistors are connected together to the intermediate node, each of drain terminals of the fourth transistors is connected to the first current source in each of the digital-to-analog converter units.

4. The ramp generator of claim 3, wherein the switch is configured to reset a direct-current level of the intermediate voltage on the intermediate node according to the bias voltage, and each of the fourth transistors is configured to form a diverged current to suppress an operating current of the digital-to-analog converter.

5. The ramp generator of claim 2, wherein the noise cancellation circuit comprises:

a low-dropout regulator;

a fifth transistor, wherein a drain terminal and a gate terminal of the fifth transistor are connected to a third current source for forming a bias voltage, a source terminal of the fifth transistor is connected to the low-dropout regulator;

a switch, coupled between the fifth transistor and the intermediate node; and a plurality of sixth transistors, wherein gate terminals of the sixth transistors are connected together to the intermediate node, each of drain terminals of the sixth transistors is connected to the first current source in each of the digital-to-analog converter units.

6. The ramp generator of claim 5, wherein the switch is configured to reset a direct-current level of the intermediate voltage on the intermediate node according to the bias voltage, and each of the sixth transistors is configured to form a supplemental current to the digital-to-analog converter, wherein a current amplitude of the supplemental current is negatively correlated with the alternating-current component of the intermediate voltage.

7. The ramp generator of claim 1, wherein the ramp generator is configured to generate a ramp output signal to an image readout circuit, the image readout circuit comprises:

a buffer stage, coupled to the ramp generator, and configured to generate a ramp buffer signal according to the ramp output signal;

a readout comparator, coupled to the buffer stage and a photoelectric sensing pixel, and configured to compare a pixel sensing voltage from the photoelectric sensing pixel with the ramp buffer signal for generating a comparison result; and a counter, coupled to the readout comparator, and configured to generate a digital output signal according to the comparison result, the digital output signal is configured to indicate a gray level or a brightness level of the pixel sensing voltage.

8. The ramp generator of claim 7, wherein the noise cancellation circuit comprises:

a low-dropout regulator;

a seventh transistor, wherein a drain terminal and a gate terminal of the seventh transistor are connected to a fourth current source for forming a bias voltage, a source terminal of the seventh transistor is connected to the low-dropout regulator;

a switch, coupled between the seventh transistor and the intermediate node; and an eighth transistor, wherein a gate terminal of the eighth transistor is connected to the intermediate node, a drain terminal of the eighth transistor is connected to the buffer stage.

9. The ramp generator of claim 8, wherein the buffer stage comprises a ninth transistor, wherein a gate terminal of the ninth transistor is configured to receive the ramp output signal, a drain terminal of the ninth transistor is configured to generate the ramp buffer signal, wherein the switch is configured to reset a direct-current level of the intermediate voltage on the intermediate node according to the bias voltage, the eighth transistor is configured to form a supplemental voltage to the drain terminal of the ninth transistor, wherein a voltage level of the supplemental voltage is negatively correlated with the alternating-current component of the intermediate voltage.

10. The ramp generator of claim 7, wherein the readout comparator comprises a first comparator, a second comparator and an inverter, wherein the noise cancellation circuit comprises:

a third capacitor, coupled between a negative input of the first comparator and the intermediate node;

a fourth capacitor, coupled between a positive input of the first comparator and a signal source of a bias voltage; and a switch, coupled between the signal source of the bias voltage and the intermediate node.

11. The ramp generator of claim 10, wherein the switch is configured to reset a direct-current level of the intermediate voltage on the intermediate node according to the bias voltage, the third capacitor is configured to form a supplemental voltage to the negative input of the first comparator, wherein a voltage level of the supplemental voltage is positively correlated with the alternating-current component of the intermediate voltage.

12. An image sensing device, comprising:

a ramp generator, configured to generate a ramp output signal, wherein the ramp generator comprises:

a digital-to-analog converter, having a first output terminal and a second output terminal, and configured to generate a ramp-up voltage signal on the first output terminal and a ramp-down voltage signal on the second output terminal, wherein the ramp output signal is generated according to the ramp-up voltage signal or the ramp-down voltage signal;

a first capacitor, coupled between the first output terminal and an intermediate node;

a second capacitor, coupled between the second output terminal and the intermediate node; and a noise cancellation circuit, coupled with the intermediate node, and configured to provide a compensation feedback according to an intermediate voltage on the intermediate node, wherein the compensation feedback is correlated to an alternating-current component of the intermediate voltage, the compensation feedback is configured for compensating an intrinsic noise of the digital-to-analog converter; and an image readout circuit, coupled to the ramp generator and a photoelectric sensing pixel, the image readout circuit is configured to sample a pixel sensing voltage from the photoelectric sensing pixel in reference with the ramp output signal from the ramp generator, so as to generate a digital output signal.

13. The image sensing device of claim 12, wherein the image readout circuit comprises:

a buffer stage, coupled to the ramp generator, and configured to generate a ramp buffer signal according to the ramp output signal;

a readout comparator, coupled to the buffer stage and the photoelectric sensing pixel, and configured to compare the pixel sensing voltage from the photoelectric sensing pixel with the ramp buffer signal for generating a comparison result; and a counter, coupled to the readout comparator, and configured to generate the digital output signal according to the comparison result, the digital output signal is configured to indicate a gray level or a brightness level of the pixel sensing voltage.

14. The image sensing device of claim 13, wherein the digital-to-analog converter comprises a plurality of digital-to-analog converter units, each of the digital-to-analog converter units comprises a first current source, a first transistor and a second transistor, the first transistor in each of the digital-to-analog converter units is controlled by one code bit of a first digital code for generating the ramp-up voltage signal, the second transistor in each of the digital-to-analog converter units is controlled by one code bit of a second digital code for generating the ramp-down voltage signal.

15. The image sensing device of claim 14, wherein the noise cancellation circuit comprises:

a third transistor, wherein a drain terminal and a gate terminal of the third transistor are connected to a second current source for forming a bias voltage;

a switch, coupled between the third transistor and the intermediate node; and a plurality of fourth transistors, wherein gate terminals of the fourth transistors are connected together to the intermediate node, each of drain terminals of the fourth transistors is connected to the first current source in each of the digital-to-analog converter units.

16. The image sensing device of claim 14, wherein the noise cancellation circuit comprises:

a low-dropout regulator;

a fifth transistor, wherein a drain terminal and a gate terminal of the fifth transistor are connected to a third current source for forming a bias voltage, a source terminal of the fifth transistor is connected to the low-dropout regulator;

a switch, coupled between the fifth transistor and the intermediate node; and a plurality of sixth transistors, wherein gate terminals of the sixth transistors are connected together to the intermediate node, each of drain terminals of the sixth transistors is connected to the first current source in each of the digital-to-analog converter units.

17. The image sensing device of claim 13, wherein the noise cancellation circuit comprises:

a low-dropout regulator;

a seventh transistor, wherein a drain terminal and a gate terminal of the seventh transistor are connected to a fourth current source for forming a bias voltage, a source terminal of the seventh transistor is connected to the low-dropout regulator;

a switch, coupled between the seventh transistor and the intermediate node; and an eighth transistor, wherein a gate terminal of the eighth transistor is connected to the intermediate node, a drain terminal of the eighth transistor is connected to the buffer stage.

18. The image sensing device of claim 13, wherein the readout comparator comprises a first comparator, a second comparator and an inverter, wherein the noise cancellation circuit comprises:

a third capacitor, coupled between a negative input of the first comparator and the intermediate node;

a fourth capacitor, coupled between a positive input of the first comparator and a signal source of a bias voltage; and a switch, coupled between the signal source of the bias voltage and the intermediate node.

* * * * *